US012668732B2

(12) United States Patent
Jovic et al.

(10) Patent No.: US 12,668,732 B2
(45) Date of Patent: Jun. 30, 2026

(54) METHOD OF COOLING AN ELECTRICAL EQUIPMENT SYSTEM BY USING A DIELECTRIC FLUID COMPOSITION HAVING GOOD HEAT DISSIPATION OVER A WIDE TEMPERATURE RANGE

(71) Applicant: Evonik Operations GmbH, Essen (DE)

(72) Inventors: Kristina Jovic, Singapore (SG);
Roland Wilkens, Gernsheim (DE);
Stefan Hilf, Zwingenberg (DE)

(73) Assignee: Evonik Operations GmbH, Essen (DE)

( * ) Notice: Subject to any disclaimer, the term of this patent is extended or adjusted under 35 U.S.C. 154(b) by 0 days.

(21) Appl. No.: 19/137,505

(22) PCT Filed: Nov. 30, 2023

(86) PCT No.: PCT/EP2023/083754
§ 371 (c)(1),
(2) Date: Jun. 10, 2025

(87) PCT Pub. No.: WO2024/126069
PCT Pub. Date: Jun. 20, 2024

(65) Prior Publication Data
US 2026/0015536 A1     Jan. 15, 2026

(30) Foreign Application Priority Data
Dec. 13, 2022     (EP) ..................................... 22212971

(51) Int. Cl.
*C09K 5/10*        (2006.01)
*H01M 10/613*      (2014.01)
(Continued)

(52) U.S. Cl.
CPC ............. *C09K 5/10* (2013.01); *H01M 10/613* (2015.04); *H01M 10/6567* (2015.04); *H05K 7/20236* (2013.01)

(58) Field of Classification Search
CPC .. C09K 5/10; H01M 10/613; H01M 10/6567; H05K 7/20236
See application file for complete search history.

(56) References Cited

U.S. PATENT DOCUMENTS

2023/0313015 A1*  10/2023  Hartikainen  ........... C09K 5/063
                                                    361/679.53
2023/0361388 A1*  11/2023  Garrait .............. H01M 10/6569
2023/0365850 A1*  11/2023  Kramer ................... B60L 58/26

FOREIGN PATENT DOCUMENTS

CN        104798143  A  *  7/2015  ............... H01B 3/20
CN        104822812  A  *  8/2015  .......... C10M 169/04
                    (Continued)

OTHER PUBLICATIONS

Translation of CN104798143A named Translation—CN104798143A (Year: 2015).*

(Continued)

*Primary Examiner* — Paul Alvare
(74) *Attorney, Agent, or Firm* — Grüneberg Global IP, PLLC

(57) ABSTRACT
A method of cooling an electrical equipment system by using a dielectric fluid composition containing a base fluid containing hydrogenated oligomers obtained from the oligomerization of butene. The method provides good and consistent heat dissipation of the electrical equipment system over a wide temperature range.

15 Claims, 1 Drawing Sheet

(51) Int. Cl.
*H01M 10/6567* (2014.01)
*H05K 7/20* (2006.01)

(56) References Cited

FOREIGN PATENT DOCUMENTS

| DE | 10 2004 018753 A1 | 11/2005 |
| WO | WO-2018078024 A1 * | 5/2018 | .......... C10M 105/04 |
| WO | 2022/038313 A1 | 2/2022 |

OTHER PUBLICATIONS

Translation of CN104822812A named Translation—CN104822812A (Year: 2015).*
Translation of WO2018078024A1 named Translation—WO2018078024A1 (Year: 2018).*
International Search Report received for PCT Application No. PCT/EP2023/083754, mailed on Feb. 2, 2024, 5 pages.
Written Opinion received for PCT Application No. PCT/EP2023/083754, mailed on Feb. 2, 2024, 6 pages.

* cited by examiner

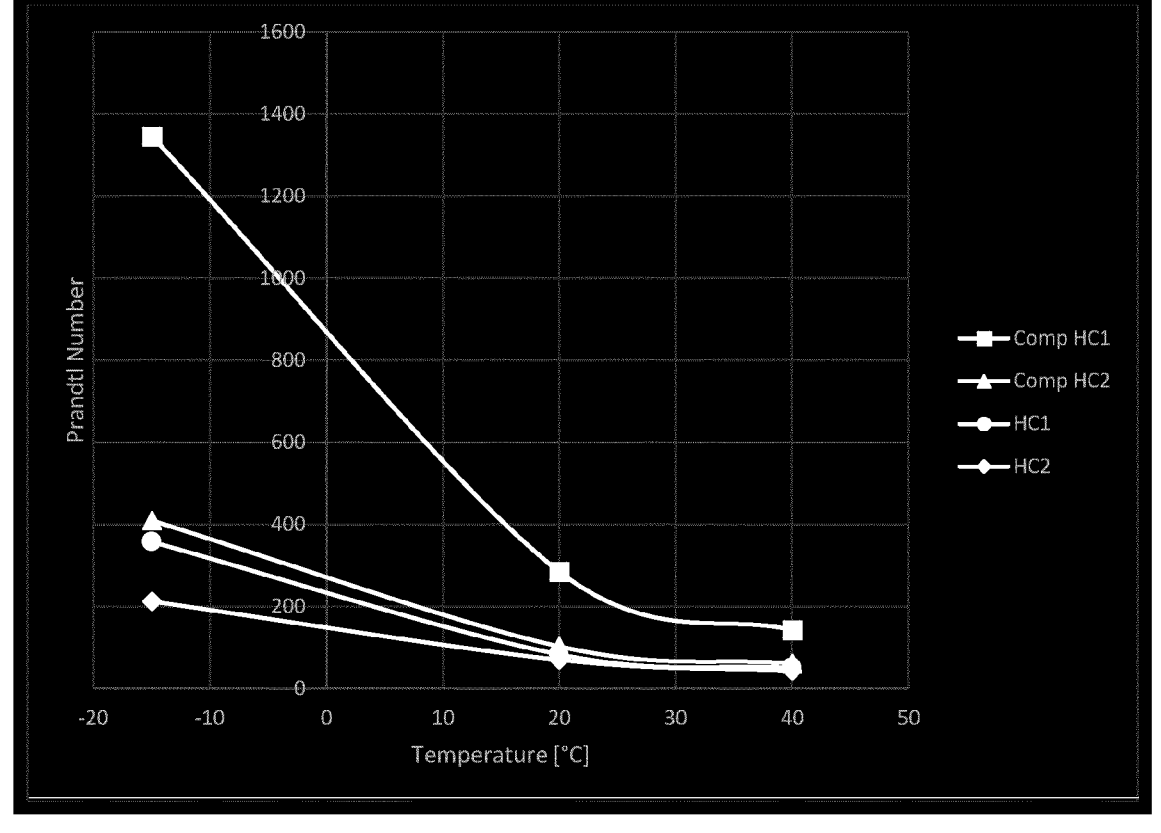

METHOD OF COOLING AN ELECTRICAL EQUIPMENT SYSTEM BY USING A DIELECTRIC FLUID COMPOSITION HAVING GOOD HEAT DISSIPATION OVER A WIDE TEMPERATURE RANGE

CROSS-REFERENCE TO RELATED APPLICATIONS

This application is a National Stage entry under § 371 of International Application No. PCT/EP2023/083754, filed on Nov. 30, 2023, and which claims the benefit of priority to European Application No. 22212971.0, filed on Dec. 13, 2022.

TECHNICAL FIELD OF THE INVENTION

The invention relates to a method of cooling an electrical equipment system by using a dielectric fluid composition comprising a base fluid A) comprising hydrogenated oligomers obtained from the oligomerization of butene. The method according to the invention provides excellent and consistent heat dissipation of the electrical equipment system over a wide temperature range.

BACKGROUND OF THE INVENTION

The present invention relates to the field of thermal management fluids for direct cooling. More efficient as well as fast charging battery applications require effective cooling systems to dissipate heat from low to high voltage applications, e.g. pure electric vehicles (EVs), hybrid electric vehicles (HEVs), fuel cell electric vehicles, computers, transformers, capacitors, high voltage cables, switchgear, and whose function is to provide electrical insulation, suppress corona and arcing. Next to air and indirect cooling, there is direct liquid immersion cooling, which is the most efficient cooling technology. Especially for larger batteries e.g. in electric vehicles there is a high amount of heat generated during charging and discharging processes. The optimum temperature for lithium-ion batteries is 20-40° C., any higher temperature would decrease battery performance and longevity, and may lead to battery failures like thermal runaway. This is the reason why there is a need for efficient thermal management fluids.

Currently available cooling fluids are typically hydrocarbon-based cooling fluids with a high amount of C17 or longer branched alkyl chains. For example, WO2022038313 discloses renewable paraffinic composition comprising a major amount of a mixture of C17 and C18 paraffins. It is also described that the composition should comprise less than 10 wt % C16, and preferably less than 5 wt % as exemplified in the experimental part, where the compositions comprise a total amount of around 4 wt % C16 iso- and n-paraffins and approximately 90 wt % or more of a mixture of C17 and C18 iso- and n-paraffins.

WO2018078024 describes heat transfer fluids with a boiling point from 200 to 400° C. and a boiling range below 80° C., wherein said fluids comprise more than 95% by weight of iso-paraffins and less than 3% naphthene. While this document focuses mainly on specific heat capacity and lubricity properties, it is silent on cold flow properties (pour point and viscosities at low temperatures), which are crucial for a broad temperature range application as thermal management fluid.

These thermal management compositions comprising hydrocarbons with high branched alkyl chains (major amount C17 or longer branched alkyl chains) cause problems, especially in regard to low temperature performance over a broad temperature range of use. Therefore, an object of the present invention was to provide a new thermal management method of cooling an electrical equipment system, wherein the thermal management fluid composition should have a low electrical conductivity, low viscosity, excellent thermal properties over a wide temperature range while maintaining low pour point, high flash point and high auto ignition temperatures.

BRIEF SUMMARY OF THE INVENTION

After thorough investigation, the inventors of the present invention have surprisingly found that hydrogenated branched isoparaffinic oligomers of butene as defined in claim 1, with a predominant amount of hydrogenated branched isoparaffinic oligomers with an alkyl chain of 16 carbon atoms, solves the above technical problem and provides, excellent and consistent heat dissipation over a wide temperature range, while having excellent low temperature performance as well as high flash point and auto ignition point.

Therefore, in a first aspect, the present invention relates to a method of cooling an electrical equipment system as defined in claim 1.

BRIEF DESCRIPTION OF THE DRAWING

For the purpose of better illustrating the advantages and properties of the claimed method of cooling, object of the present invention, one graph is attached as a non-limiting example:

FIG. 1 is a graph showing heat dissipation performance of different hydrocarbons from −15° C. to 40° C. The dielectric fluid composition Comp. HC1 (■) shows a steep increase in Prandtl Number at lower temperatures. The dielectric fluid compositions Comp. HC2 (▲) and HC1 (●) show a similar behavior at high and medium temperature. However, the dielectric fluid composition HC1 has a lower increase in Prandtl number at lower temperatures. The dielectric fluid composition HC2 (♦) shows the lowest Prandtl number with a very low slope over the whole temperature profile.

DETAILED DESCRIPTION OF THE INVENTION

Thus, the present invention relates to a method of cooling an electrical equipment system by using a dielectric fluid composition comprising a base fluid A) comprises hydrogenated oligomers obtained from the oligomerization of butene, and wherein the base fluid A) comprises, based on the total weight of the base fluid A),
- a) from 50 to 78% by weight of hydrogenated branched isoparaffinic oligomers with an alkyl chain of 16 carbon atoms,
- b) from 22 to 50% by weight of hydrogenated branched isoparaffinic oligomers with an alkyl chain of 20 carbon atoms or with an alkyl chain of 24 carbon atoms or a mixture thereof,
- c) from 0 to 5% by weight of hydrogenated branched isoparaffinic oligomers with an alkyl chain of more than 28 carbon atoms and wherein the hydrogenated oligomers a), b) and c) of the base fluid A) have an iodine value of less than 3 g iodine/100 g of oligomer according to DIN 14111.

In other words, the base fluid A) comprises hydrogenated oligomers obtained from the oligomerization of butene of Formula (I), Formula (II) and Formula (III)

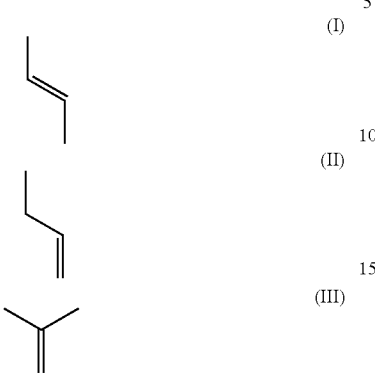

(I)

(II)

(III)

and wherein the base fluid A) comprises, based on the total weight of the base fluid A),
  a) from 50 to 78% by weight of hydrogenated branched isoparaffinic oligomers with an alkyl chain of 16 carbon atoms,
  b) from 22 to 50% by weight of hydrogenated branched isoparaffinic oligomers with an alkyl chain of 20 carbon atoms or with an alkyl chain of 24 carbon atoms or a mixture thereof,
  c) from 0 to 5% by weight of hydrogenated branched isoparaffinic oligomers with an alkyl chain of more than 28 carbon atoms
and wherein the hydrogenated oligomers a), b) and c) of the base fluid A) have an iodine value of less than 3 g iodine/100 g of oligomer according to DIN 14111.

According to another preferred embodiment, the base fluid A) comprises hydrogenated oligomers obtained from the oligomerization of butene of Formula (I), Formula (II) and Formula (III) and the content of oligomers obtained from the oligomerization of butene of Formula (III) is less than 10% by weight, preferably less than 8% by weight, even more preferably less than 5% by weight, based on the total weight of the base fluid A). Preferably, the base fluid A) consists of hydrogenated oligomers obtained from the oligomerization of butene.

In a preferred embodiment of the invention, the base fluid A), comprising hydrogenated branched isoparaffinic saturated oligomers obtained from the oligomerization of butene and further hydrogenation step, is free of n-paraffins and aromatic components. More preferably, the base fluid A) consists of hydrogenated branched isoparaffinic saturated oligomers obtained from the oligomerization of butene of Formula (I), Formula (II) and Formula (III) and is free of n-paraffins and aromatic components.

In another preferred embodiment of the invention, the base fluid A) comprises, based on the total weight of the base fluid A),
  a) from 55 to 78% by weight of hydrogenated branched isoparaffinic oligomers with an alkyl chain of 16 carbon atoms,
  b) from 22 to 45% by weight of hydrogenated branched isoparaffinic oligomers with an alkyl chain of 20 carbon atoms or with an alkyl chain of 24 carbon atoms or a mixture thereof,
  c) from 0 to 5% by weight of hydrogenated branched isoparaffinic oligomers with an alkyl chain of more than 28 carbon atoms.

4

Yet in another preferred embodiment of the invention, the base fluid A) comprises, based on the total weight of the base fluid A),
  a) from 60 to 75% by weight of hydrogenated branched isoparaffinic oligomers with an alkyl chain of 16 carbon atoms,
  b) from 25 to 40% by weight of hydrogenated branched isoparaffinic oligomers with an alkyl chain of 20 carbon atoms or with an alkyl chain of 24 carbon atoms or a mixture thereof,
  c) from 0 to 5% by weight of hydrogenated branched isoparaffinic oligomers with an alkyl chain of more than 28 carbon atoms.

In an even more preferred embodiment of the present invention, the base fluid A) comprises, based on the total weight of the base fluid A),
  a) from 60 to 70% by weight of hydrogenated branched isoparaffinic oligomers with an alkyl chain of 16 carbon atoms,
  b) from 30 to 40% by weight of hydrogenated branched isoparaffinic oligomers with an alkyl chain of 20 carbon atoms or with an alkyl chain of 24 carbon atoms or a mixture thereof,
  c) from 0 to 5% by weight of hydrogenated branched isoparaffinic oligomers with an alkyl chain of more than 28 carbon atoms.

According to the present invention, it is preferred that the hydrogenated branched isoparaffinic oligomers b) consists of
  50 to 98% by weight, more preferably 70 to 98% by weight, even more preferably 70 to 80% by weight, of hydrogenated branched isoparaffinic oligomers with an alkyl chain of 20 carbon atoms and
  2 to 50% by weight, more preferably 2 to 30% by weight, even more preferably 20 to 30% by weight, of hydrogenated branched isoparaffinic oligomers with an alkyl chain of 24 carbon atoms, based on the total weight of hydrogenated branched isoparaffinic oligomers b).

The base fluid A) according to the invention is prepared by the oligomerization of butene, in which the oligomerization of butene of Formula (I), Formula (II) and Formula (III) is carried out using a heterogeneous oligomerization catalyst forming an oligomerizate, followed by subsequent distillation in which the oligomers formed during the oligomerization partially separated from the residual oligomerizate. Finally, the distilled oligomers are hydrogenated. The resulting product is the base fluid A). Preferably, the base fluid A) according to the invention is prepared following the example of DE102004018753.

According to the invention, the base fluid A) comprises hydrogenated oligomers a), b) and c) obtained from the oligomerization of butene, wherein the hydrogenated oligomers a), b) and c) of the base fluid A) have an iodine value of less than 3 g iodine/100 g of oligomer, preferably less than 2 g iodine/100 g of oligomer, more preferably less than 1.5 g iodine/100 g of oligomer according to DIN 14111. The iodine value is a measure of the relative degree of unsaturation in components, as determined by the uptake of halogen. In the present invention, the iodine value is the mass of iodine in grams that is consumed by 100 grams of the hydrogenated oligomers of the base fluid A).

Preferably, the electrical equipment system is selected from the group consisting of electric batteries, electric motors, inverter, electric transformers, electric capacitors, fluid-filled transmission lines, fluid-filled power cables, computers, data servers and power electronics.

In another preferred embodiment of the invention, the method of cooling an electrical equipment system according to the invention is a direct liquid immersion cooling. In a direct liquid immersion cooling, the heat is removed from the system by circulating liquid into direct contact with hot components.

According to a preferred embodiment of the invention, the dielectric fluid composition as defined in claim 1 further comprises a base fluid B) selected from the group consisting of polyol esters, monoesters, saturated hydrocarbons, dicarboxylic acid esters, carbonates, ethers, alcohols, amines, amides, or a mixture thereof. In the context of the present invention, component B) is a base fluid, different from the base fluid A) as defined in claim 1 and throughout the present specification. Thus, preferably, the dielectric fluid composition comprises the base fluid A) according to the invention as a first base fluid, and the above-indicated component B) as a second base fluid.

Preferably, the amounts of the base fluid A) and the base fluid B) add up to at least 90% by weight, more preferably add up to at least 95% by weight, based on the total weight of the dielectric fluid composition.

Preferably, the dielectric fluid composition may further comprise an additive C) selected from the group consisting of defoamers, seal compatibility agents, antioxidants, yellow metal passivators, rust inhibitors, electrostatic discharge depressants, demulsifiers, dyes or a mixture thereof. The additive compounds C) correspond to typical additives used in thermal management fluids and are described in detail, inter alia, in T. Mang, W. Dresel (eds.): "Lubricants and Lubrication", Wiley-VCH, Weinheim 2001; R. M. Mortier, S. T. Orszulik (eds.): "Chemistry and Technology of Lubricants". Preferably, suitable yellow metal passivators are selected from the list consisting of imidazonines, imidazoles, thiazoles, thiadiazoles, triazoles, tolyltriazoles, pyridines, quinolines, morpholines or a mixture thereof.

Preferably, suitable rust inhibitors are selected from the list consisting of sulfonates, carboxylates, alkyl amines, amine carboxylates, amine borates, phosphates or a mixture thereof.

Preferably, suitable electrostatic discharge depressants are selected from the list consisting of ester quats, imidazolium quats, alkoxy alkyl quats, trialkyl monomethyl quats, monoalkyl trimethylquats, diamidoaminequats, benzyl quats, ethoxylated ether amines, ether diamines, fatty alcohols ethoxylates, ether amine oxides, ether amine quats or a mixture thereof.

Preferably, suitable demulsifiers are selected from the list consisting of polyalkoxylated phenols, polyalkoxylated polyols, polyalkoxylated polyamines or a mixture thereof.

Preferably, suitable defoamers are selected from the list consisting of silicone oils, fluorosilicone oils, fluoroalkyl ethers, polyacrylates or a mixture thereof.

Preferably, the seal compatibility agents are selected from the list consisting of adipate-ester, sebacate-ester, neopentylpolyol-ester, sulfolanes.

Preferably, the suitable antioxidants include phenol-based antioxidants and amine-based antioxidants.

In a preferred embodiment, the phenol-based antioxidants are selected from the list consisting of octadecyl-3-(3,5-di-tert-butyl-4-hydroxyphenyl)propionate; 4,4'-methylenebis(2,6-di-tert-butylphenol); 4,4'-bis(2,6-di-t-butylphenol); 4,4'-bis(2-methyl-6-t-butylphenol); 2,2'-methylenebis(4-ethyl-6-t-butylphenol); 2,2'-methylenebis(4-methyl-6-t-butyl phenol); 4,4'-butylidenebis(3-methyl-6-t-butylphenol); 4,4'-isopropylidenebis(2,6-di-t-butylphenol); 2,2'-methylenebis(4-methyl-6-nonylphenol); 2,2'- isobutylidenebis(4,6-dimethylphenol); 2,2'-methylenebis(4-methyl-6-cyclohexylphenol); 2,6-di-t-butyl-4-methylphenol; 2,6-di-t-butyl-4-ethyl-phenol; 2,4-dimethyl-6-t-butylphenol; 2,6-di-t-amyl-p-cresol; 2,6-di-t-butyi-4-(N,N'-dimethylaminomethylphenol); 4,4'thiobis(2-methyl-6-t-butylphenol); 4,4'-thiobis(3-methyl-6-t-butylphenol); 2,2'-thiobis(4-methyl-6-t-butylphenol); bis(3-methyl-4-hydroxy-5-t-butylbenzyl) sulfide; bis(3,5-di-t-butyl-4-hydroxybenzyl) sulfide; n-octyl-3-(4-hydroxy-3,5-di-t-butylphenyl)propionate; n-octadecyl-3-(4-hydroxy-3,5-di-t-butylphenyl)propionate; 2,2'-thio[diethyl-bis-3-(3,5-di-t-butyl-4-hydroxyphenyl)propionate], or a mixture thereof. Even more preferred phenol-based antioxidants are bis-phenol-based antioxidants and ester group containing phenol-based antioxidants.

Amine-based antioxidants include, for example, monoalkyldiphenylamines such as monooctyldiphenylamine, monononyldiphenylamine; dialkyldiphenylamines such as 4,4'-dibutyldiphenylamine, 4,4'-dihexyldiphenylamine, 4,4'-dipentyldiphenylamine, 4,4'-diheptyldiphenylamine, 4,4'-dioctyldiphenylamine, 4,4'-dinonyldiphenylamine; polyalkyldiphenylamines such as tetrabutyldiphenylamine, tetrahexyldiphenylamine, tetraoctyldiphenylamine, tetranonyldiphenylamine; naphthylamines, concretely alpha-naphthylamine, phenyl-alpha-naphthylamine and further alkyl-substituted phenyl-alpha-naphthylamines such as butylphenyl-alpha-naphthylamine, pentylphenyl-alpha-naphthylamine, hexylphenyl-alpha-naphthylamine, heptylphenyl-alpha-naphthylamine, octylphenyl-alpha-naphthylamine, nonylphenyl-alpha-naphthylamine. Of those, diphenylamines are preferred to naphthylamines, from the viewpoint of the antioxidation effect thereof.

According to a preferred embodiment of the invention, the dielectric fluid composition according to the invention comprises from 2 to 100% by weight of base fluid A), from 0 to 98% by weight of base fluid B), and 0 to 10% by weight of additive C), based on the total weight of the dielectric fluid composition. More preferably, the total amount of A), B) and C) adds up to at least 90% by weight, more preferably at least 95% by weight, even more preferably 100% by weight, based on the total weight of the dielectric fluid composition according to the invention.

According to a preferred embodiment of the invention, the base fluid A) has a pour point below minus 80° C. (−80° C.) according to ASTM D5950.

In the present invention, the Prandtl number (Pr) is calculated according to the formula below. The Prandtl number is a dimensionless quantity that puts the viscosity of a fluid in correlation with the thermal conductivity (see Bastian E. Rapp, in Microfluidics: Modelling, Mechanics and Mathematics, 2017). The Prandtl number is given as:

$$Pr = \vartheta / \alpha =$$

$$\text{momentum diffusivity} / \text{thermal diffusivity} = (\mu / \rho) / (k / (c_\rho \rho)) = c_\rho \mu / k$$

wherein
$\vartheta$: momentum diffusivity (kinematic viscosity) $\vartheta = \mu / \rho$; SI unit: $m^2/s$
$\alpha$: thermal diffusivity; SI unit: $m^2/s$
$\mu$: dynamic viscosity; SI unit: $Pa \cdot s = N \cdot s/m^2$
$k$: thermal conductivity; SI unit: $W/(m \cdot K)$
$c_\rho$: specific heat; SI unit: $J/(kg \cdot K)$
$\rho$: density; SI unit: $kg/m^3$ As shown in the experimental part below, the inventors of the present invention have surprisingly found out that the base fluid A) of the method according to the invention have all small Prandtl numbers over a wide range of temperatures. It confirms that the base fluids A) according to the invention have high thermal conductivity and low viscosity, which is advantageous for thermal management in electric devices. This means that the dielectric fluids of the invention are capable of efficiently exchanging heat with an electrical device. Indeed, the higher the thermal conductivity, the better the heat transfer capacity. Furthermore, the fluids show great cold flow properties.

According to a preferred embodiment, the base fluid A) of the invention has a Prandtl number below 60 at 40° C. and 1013 hPa pressure, more preferably, below 55 at 40° C. and 1013 hPa pressure.

EXPERIMENTAL PART

The invention is further illustrated in detail hereinafter with reference to examples and comparative examples, without any intention to limit the scope of the present invention.

Abbreviations

AIT Auto Ignition Temperature according to DIN 51794

Comp. HC1 Yubase 3 from SK Lubricants, which is a distillate comprising iso and n-paraffins with alkyl chains of more than 20 carbon atoms (hydrotreated light paraffinic base oil with a KV40 of 11.80 mm²/s)

Comp. HC2 PAO 2 corresponding to 1-decene based dimer

Cp Specific heat capacity at the temperature indicated in Table 1 and according to ASTM D7896-19

Elect. Cond. Electrical conductivity was measured at 25° C. according to ASTM D2624

FP Flash Point ASTM D93

HC1 64 wt % C16/34 wt % C20 and C24 hydrogenated branched isoparaffinic hydrocarbon/Rest high boiling hydrocarbons (C28 or more hydrogenated branched isoparaffinic hydrocarbons)

HC2 78 wt % C16/22 wt % C20 and C24 hydrogenated branched isoparaffinic hydrocarbon Kinematic viscosity at the temperature indicated in Table 1 and according to ASTM KV D445

PN Prandtl number at the temperature indicated in Table 1 and 1013 hPa (1 atm)

PP Pour Point according to ASTM D5950

λ Thermal conductivity at the temperature indicated in Table 1 and according to ASTM D7896-14

δ Density at the temperature indicated in Table 1 and according to DIN EN ISO12185

Test Methods

The kinematic viscosities of the dielectric fluid compositions were measured at the temperatures indicated in Table1 (namely 40° C., 20° C. and −15° C.) and according to ASTM D445.

Specific heat capacity and thermal conductivity were measured at the temperatures indicated in Table 1 with the hot wire method according to ASTM D7896-19.

Pour point (PP) was measured according to ASTM D5950.

Flash point was measured with a closed-cup Pensky Martin set-up according to ASTM D93.

The electrical conductivity was measured at 25° C. according to ASTM D2624.

Density was measured at the temperatures indicated in Table 1 and according to DIN EN ISO 12185.

The Auto Ignition Temperature was measured according to DIN 51794.

The quantitative analysis of the thermal management fluids components was measured via gas chromatography. The analysis was carried out with a quartz capillary column DB-5 5% Diphenyl/95% Dimethylpolysiloxan (30 m×0.25 mm×0.25 µm) from Agilent, interfaced with a flame ionization detector. The temperature program was 50° C. for 4 min which increased to 350° C. for 20 min. The flow rate was 1.5 mL/min for 34 min which was increased to 2 mL/min. The injection temperature is 280° C. and the detector temperature 350° C. Helium gas was used as a carrier gas and was adjusted to column velocity flow of 1.5 mL/min.

For the identification of the chromatogram peaks mass spectroscopy was used. The analysis was carried out with a quartz capillary column DB-5 5% Diphenyl/95% Dimethylpolysiloxan (30 m×0.25 mm×0.25 µm) from Agilent, interfaced with a mass spectrometer. The temperature program was 80° C. for 2 min which increased to 320° C. for 22 min. The injection temperature is 250° C. and the carrier flow 1.1 mL/min.

The degree of hydrogenation of hydrogenated oligomers a), b) and c) obtained from the oligomerization of butene of the base fluid was determined according to DIN 14111.

Preparation of the Base Fluids

The base fluid HC1 is prepared in the same manner as the example in DE102004018753. Butene compounds of Formula (I), (II) and (III) are being oligomerized in the presence of a nickel catalyst.

Next, the formed C16-oligomers are separated by distillation and finally hydrogenated.

Analysis of the product shows that the base fluid consists of 64 wt % C16/34 wt % C20 and C24 branched isoparaffinic hydrocarbon/Rest high boiling hydrocarbons (C28 or more branched isoparaffinic hydrocarbons).

The iodine value according to DIN 14111 of the base fluid HC1 is 1.3 g iodine/100 g oligomers.

The base fluid HC2 is prepared following the same procedure as for the base fluid HC1. The product obtained by further purification via distillation has the following composition:

Analysis of the product shows that the base fluid consists of 78 wt % C16/22 wt % C20 and C24 branched isoparaffinic hydrocarbon.

The iodine value according to DIN 14111 of the base fluid HC1 is 1.3 g iodine/100 g oligomers.

The comparative base fluid Comp. HC1 is a distillate comprising iso and n-paraffins with alkyl chains of more than 20 carbon atoms (hydrotreated light paraffinic base oil with a KV40 of 11.80 mm2/s).

The comparative base fluid Comp. HC2 corresponds to 1-decene based dimer.

The base fluid examples according to the invention (base fluid A) of claim 1) and the comparative base fluid examples (Comp. HC) are shown in Table 1 below with their respective physical properties.

TABLE 1

Thermal management properties of the thermal management
fluid compositions according to the invention

|  |  | Inventive examples | | Comparative examples | |
| --- | --- | --- | --- | --- | --- |
|  | Units | HC1 | HC2 | Comp. HC1 | Comp. HC2 |
| KV40 | cSt | 4.1 | 3.5 | 11.8 | 5.1 |
| KV20 | cSt | 7.1 | 5.9 | 24.5 | 8.9 |
| KV-15 | cSt | 32.4 | 25.2 | 183.6 | 37.8 |
| λ@40° C. | mW/m*K | 120.9 | 120.8 | 132.3 | 135.0 |
| λ@20° C. | mW/m*K | 124.2 | 124.0 | 135.2 | 138.7 |
| λ@-15° C. | mW/m*K | 128.2 | 128.7 | 140.5 | 145.3 |
| Cp@40° C. | kJ/kg*K | 1.9 | 1.9 | 2.0 | 2.1 |
| Cp@20° C. | kJ/kg*K | 1.8 | 1.8 | 1.9 | 2.0 |
| Cp@-15° C. | kJ/kg*K | 1.7 | 1.7 | 1.8 | 1.9 |
| δ@40° C. | g/cm$^3$ | 0.788 | 0.782 | 0.815 | 0.781 |
| δ@20° C. | g/cm$^3$ | 0.797 | 0.793 | 0.827 | 0.794 |
| δ@15° C. | g/cm$^3$ | 0.805 | 0.799 | 0.831 | 0.797 |
| δ@-15° C. | g/cm$^3$ | 0.825 | 0.819 | 0.850 | 0.817 |
| PN40° C. | — | 50 | 43 | 142 | 61 |
| PN20° C. | — | 83 | 70 | 285 | 103 |
| PN-15° C. | — | 357 | 212 | 1346 | 409 |
| PP | ° C. | −90 | −93 | −33 | −75 |
| FP | ° C. | 124 | 121 | 191 | 160 |
| Autoignition Point | ° C. | 275 | n.m. | 260 | 324 | n.m. not measured

As shown in Table 1 above, the C16-enriched hydrocarbon base fluids according to the invention (Examples HC1 and HC2) have very good thermal conductivity properties combined with low viscosity and excellent low temperature performance. In contrast, Comparative Examples Comp. HC1 and Comp. HC2 do not combine all together the above-indicated properties and thus do not perform so efficiently.

Furthermore, although the C16-enriched hydrocarbon base fluid Example HC1 according to the invention shows an acceptable flash point (124° C.), surprisingly the autoignition point of HC1 is superior to the autoignition point of Comp. HC1 (275° C. versus 260° C., respectively). This is of course a big advantage to hinder self-ignition when the electrical system has a malfunction which would cause a thermal runaway.

Table 2 below shows the evolution of the Prandtl Index value of some thermal management fluid compositions according to the invention and some comparative thermal management fluids over a wide range of temperature. The slope indicates the efficiency of the Prandtl number over a wide temperature range, the lower the increase the better is the efficiency. The intercept describes the Prandtl number at 0° C. Again, the lower the Prandtl number the better the heat removal of the electric system. This is also reflected in FIG. 1 in the present invention.

TABLE 2

Evolution of the Prandtl Index value of some thermal management
fluid composition over a range of temperature

| Compound | Slope | Intercept |
| --- | --- | --- |
| Comp. HC1 | −22.8 | 933.4 |
| Comp. HC2 | −6.6 | 289.9 |
| HC1 | −5.8 | 251.1 |
| HC2 | −2.2 | 115.5 |

The comparative thermal management fluid Comp. HC1 shows a sharp increase in the slope at 30° C., and therefore does not fulfill a steady thermal management effect over a wide range of temperature.

The comparative thermal management fluid composition Comp. HC2 also shows an increase of the Prandtl Index value. Even if the results are better than for the comparative thermal management fluid Comp. HC1, the slope for the base fluid Comp. HC2 is steeper than the slopes of the inventive base fluids HC1 and HC2 according to the invention.

In particular, the inventive base fluid HC2 shows the lowest slope. Indeed, the Prandtl Index value slope should be steady over a wide temperature profile. This is observed by the inventive thermal management fluid compositions according to the invention, where a clear improvement can be observed.

The experimental data above show that C16-enriched hydrocarbon base fluids A) according to the invention have small and steady Prandtl numbers over a wide temperature range. This confirms that the dielectric fluid compositions according to the invention have high thermal conductivity and low viscosity over a wide temperature range, which is advantageous for effective circulation and pumpability to dissipate heat in electric devices. Furthermore, the base fluids A) according to the invention have excellent cold flow properties (very low pour point values as shown in Table 1).

The invention claimed is:

1. A method, comprising:
   cooling an electrical equipment system by a dielectric fluid composition comprising a base fluid A) comprising hydrogenated oligomers obtained from oligomerization of butene, and wherein the base fluid A) comprises, based on a total weight of the base fluid A),
   a) from 50 to 78% by weight of hydrogenated branched isoparaffinic oligomers with an alkyl chain of 16 carbon atoms,
   b) from 22 to 50% by weight of hydrogenated branched isoparaffinic oligomers with an alkyl chain of 20 carbon atoms or with an alkyl chain of 24 carbon atoms or a mixture thereof,
   c) from 0 to 5% by weight of hydrogenated branched isoparaffinic oligomers with an alkyl chain of more than 28 carbon atoms, and wherein the hydrogenated branched isoparaffinic oligomers a), b) and c) of the base fluid A) have an iodine value of less than 3 g iodine/100 g of oligomer according to DIN 14111.

2. The method according to claim 1, wherein the base fluid A) is free of n-paraffins and aromatic components.

3. The method according to claim 1, wherein the base fluid A) comprises, based on the total weight of the base fluid A),
a) from 55 to 78% by weight of hydrogenated branched isoparaffinic oligomers with an alkyl chain of 16 carbon atoms,
b) from 22 to 45% by weight of hydrogenated branched isoparaffinic oligomers with an alkyl chain of 20 carbon atoms or with an alkyl chain of 24 carbon atoms or a mixture thereof,
c) from 0 to 5% by weight of hydrogenated branched isoparaffinic oligomers with an alkyl chain of more than 28 carbon atoms.

4. The method according to claim 1, wherein the hydrogenated branched isoparaffinic oligomers a), b) and c) of the base fluid A) have an iodine value of less than 2 g iodine/100 g of oligomer according to DIN 14111.

5. The method according to claim 1, wherein the base fluid A) comprises, based on the total weight of the base fluid A),
a) from 60 to 75% by weight of hydrogenated branched isoparaffinic oligomers with an alkyl chain of 16 carbon atoms,
b) from 25 to 40% by weight of hydrogenated branched isoparaffinic oligomers with an alkyl chain of 20 carbon atoms or with an alkyl chain of 24 carbon atoms or a mixture thereof,
c) from 0 to 5% by weight of hydrogenated branched isoparaffinic oligomers with an alkyl chain of more than 28 carbon atoms.

6. The method according to claim 1, wherein the base fluid A) comprises, based on the total weight of the base fluid A),
a) from 60 to 70% by weight of hydrogenated branched isoparaffinic oligomers with an alkyl chain of 16 carbon atoms,
b) from 30 to 40% by weight of hydrogenated branched isoparaffinic oligomers with an alkyl chain of 20 carbon atoms or with an alkyl chain of 24 carbon atoms or a mixture thereof,
c) from 0 to 5% by weight of hydrogenated branched isoparaffinic oligomers with an alkyl chain of more than 28 carbon atoms.

7. The method according to claim 1, wherein the hydrogenated branched isoparaffinic oligomers b) consist of 50 to 98% by weight of hydrogenated branched isoparaffinic oligomers with an alkyl chain of 20 carbon atoms and 2 to 50% by weight of hydrogenated branched isoparaffinic oligomers with an alkyl chain of 24 carbon atoms, based on a total weight of hydrogenated branched isoparaffinic oligomers b).

8. The method according to claim 7, wherein the hydrogenated branched isoparaffinic oligomers b) consist of 70 to 98% by weight of hydrogenated branched isoparaffinic oligomers with an alkyl chain of 20 carbon atoms and 2 to 30% by weight of hydrogenated branched isoparaffinic oligomers with an alkyl chain of 24 carbon atoms, based on the total weight of hydrogenated branched isoparaffinic oligomers b).

9. The method according to claim 8, wherein the branched isoparaffinic oligomers b) consist of 70 to 80% by weight of hydrogenated branched isoparaffinic oligomers with an alkyl chain of 20 carbon atoms and 20 to 30% by weight of hydrogenated branched isoparaffinic oligomers with an alkyl chain of 24 carbon atoms, based on the total weight of hydrogenated branched isoparaffinic oligomers b).

10. The method according to claim 1, wherein the electrical equipment system is selected from the group consisting of electric batteries, electric motors, inverters, electric transformers, electric capacitors, fluid-filled transmission lines, fluid-filled power cables, computers, data servers and power electronics.

11. The method according to claim 1, wherein the method of cooling an electrical equipment system is a direct liquid immersion cooling.

12. The method according to claim 1, wherein the dielectric fluid composition further comprises a base fluid B) selected from the group consisting of polyol esters, monoesters, saturated hydrocarbons, dicarboxylic acid esters, carbonates, ethers, alcohols, amines, amides, and a mixture thereof.

13. The method according to claim 1, wherein the dielectric fluid composition further comprises an additive C) selected from the group consisting of defoamers, seal compatibility agents, antioxidants, yellow metal passivators, rust inhibitors, electrostatic discharge depressants, demulsifiers, dyes, and a mixture thereof.

14. The method according to claim 1, wherein the dielectric fluid composition comprises 2 to 100% by weight of base fluid A), 0 to 98% by weight of base fluid B), and 0 to 10% by weight of additive C), based on a total weight of the dielectric fluid composition.

15. The method according to claim 1, wherein the amounts of A) to C) add up to at least 90% by weight, based on a total weight of the dielectric fluid composition.

* * * * *